United States Patent
Kim et al.

(10) Patent No.: US 6,806,189 B2
(45) Date of Patent: Oct. 19, 2004

(54) METHOD OF SILVER (AG) ELECTROLESS PLATING ON ITO ELECTRODE

(75) Inventors: Jae-Jeong Kim, Seoul (KR); Seung-Hwan Cha, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/330,431

(22) Filed: Dec. 30, 2002

(65) Prior Publication Data

US 2003/0170925 A1 Sep. 11, 2003

(30) Foreign Application Priority Data

Mar. 7, 2002 (KR) .............................. 10-2002-0012277

(51) Int. Cl.[7] .............................................. H01L 21/44
(52) U.S. Cl. .................... 438/678; 438/686; 438/608
(58) Field of Search ................... 438/678, 686, 438/608

(56) References Cited

U.S. PATENT DOCUMENTS

| | | | | |
|---|---|---|---|---|
| 4,235,648 A | * | 11/1980 | Richardson | 438/635 |
| 4,668,532 A | * | 5/1987 | Moisan et al. | 427/97 |
| 6,228,768 B1 | * | 5/2001 | Woo et al. | 438/691 |
| 2002/0168309 A1 | * | 11/2002 | Doubrava et al. | 423/22 |

* cited by examiner

*Primary Examiner*—Lynne A. Gurley
(74) *Attorney, Agent, or Firm*—McKenna Long & Aldridge LLP (57) ABSTRACT

A method of silver (Ag) electroless plating on an indium tin oxide (ITO) electrode comprises preparing a substrate on which the indium tin oxide (ITO) electrode is formed, depositing tin (Sn) on the indium tin oxide (ITO) electrode, depositing silver (Ag) on the indium tin oxide (ITO) electrode by dipping the indium tin oxide (ITO) electrode into an activation solution and plating silver (Ag) on the indium tin oxide (ITO) electrode by dipping the indium tin oxide (ITO) electrode into an electroless plating solution containing magnesium ions and silver ions.

57 Claims, 8 Drawing Sheets

METHOD OF SILVER (AG) ELECTROLESS PLATING ON ITO ELECTRODE

This application claims the benefit of Korean Patent Application No. 2002-12277, filed on Mar. 7, 2002 in Korea, which is hereby incorporated by reference for all purposes as if fully set forth herein.

BACKGROUND OF THE INVENTION

1. Field of the Invention

The present invention relates to a method of silver (Ag) electroless plating on indium tin oxide (ITO) electrode or metal electro lines for a liquid crystal display (LCD) device or a semiconductor element and more particularly, to a method for plating silver (Ag) on indium tin oxide (ITO) electrode or other metal electro lines for the liquid crystal display (LCD) device or the semiconductor element to lower electric resistance of the indium tin oxide (ITO) electrode or the metal lines.

2. Discussion of the Related Art

Generally, a transparent indium tin oxide (ITO) electrode is used as an electrode of flat panel display devices such as a liquid crystal display (LCD) device or a plasma display panel (PDPs). However, as a size of the flat panel display device becomes bigger, the indium tin oxide (ITO) has a disadvantage in that it has a high specific resistance, and thus is not suitable for the large sized flat panel display devices. To overcome this disadvantage, metal having a low resistance is usually plated on the indium tin oxide (ITO) electrode. A representative low resistance metal is silver (silver) and the silver (Ag) may be formed on the indium tin oxide (ITO) electrode in many ways. For example, the silver (Ag) may be formed on the indium tin oxide (ITO) electrode by a sputtering method, a heat-deposition method or a chemical vapor deposition method. However, in case of above mentioned methods, because a sputtering or a deposition of silver (Ag) is not selectively carried out only on the indium tin oxide (ITO) electrode, but on a whole area of a substrate, an additional etching process is needed to remove the unwanted silver, and thus an array substrate manufacturing process becomes complex. A silver (Ag) plating method is suggested to overcome this problem. In case of the silver (Ag) plating method, a manufacturing cost is low and silver (Ag) having a high purity can be obtained compared to other Ag forming methods that are mentioned above. Besides, the silver (Ag) plating method does little damage onto the substrate because it is carried out at a low temperature condition. An electroless plating method, in which an electric current is not applied to plating solution to reduce metal ions in the plating solution, but the metal ions are reduced and then plated on a metal film by a reducing agent in the solution, has been frequently selected among many plating methods. A plating method of silver (Ag) on the indium tin oxide (ITO) electrode using the electroless plating method will be described hereinafter.

To begin with, organic material that exists on the indium tin oxide (ITO) electrode should be removed. A catalytic metal is then deposited on the indium tin oxide (ITO) electrode to oxidize a reducing agent in the electroless plating solution. Because the catalytic metal is not easily deposited on the pure indium tin oxide (ITO) electrode, tin (Sn) is deposited on the indium tin oxide (ITO) electrode first and then the catalytic metal is deposited on the indium tin oxide (ITO) electrode. The catalytic metal may be selected from a group consisting of palladium (Pd), silver (Ag), copper (Cu) and platinum (Pt), etc., and it is efficient to use silver (Ag) as the catalytic metal for electroless plating of silver (Ag) on the indium tin oxide (ITO) electrode. Next, silver (Ag) is plated on the indium tin oxide (ITO) electrode on which the tin (Sn) and the catalytic metal are already formed using the electroless plating solution. The electroless plating solution includes silver nitrate ($AgNO_3$), cobalt sulfate ($CoSO_4$) and ammonia ($NH_3$), etc.

Figure 1:
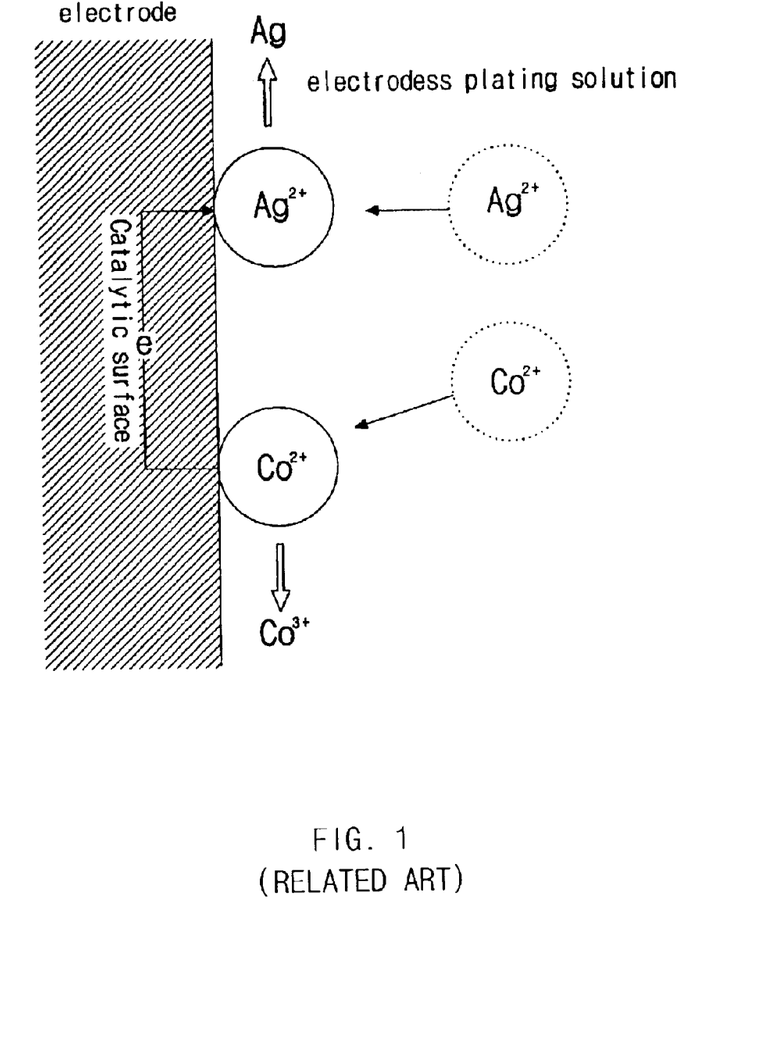
FIG. 1 is a diagram illustrating a reaction mechanism of silver (Ag) electroless plating.

FIG. 1 is a diagram illustrating a reaction mechanism of Ag (silver) electroless plating in which cobalt ion is used as a reducing agent. As shown in the figure, if an electrode that is formed one of copper (Cu), palladium (Pd), platinum (Pt) and nickel (Ni), etc. is dipped into the electroless plating solution, the cobalt sulfate ($CoSO_4$) is used as a reducing agent to reduce silver ions ($Ag^{2+}$) and the ammonia ($NH_3$) serves to form a complex compound with the silver ions ($Ag^{2+}$) and thus stabilize the silver ions ($Ag^{2+}$) in the electroless plating solution. With the above-mentioned reaction mechanism, silver (Ag) can be plated on the indium tin oxide (ITO) electrode.

However, according to a related art electroless plating method of silver (Ag), the silver agglomerates as reaction time passes by. Because a plated silver (Ag) film does not grow two-dimensionally but grows three-dimensionally and thus forms agglomerations of silver (Ag), an electric resistance becomes increased, and accordingly, the indium tin oxide (ITO) electrode on which the silver (Ag) is plated according to the related art is not suitable for an electrode of a liquid crystal display (LCD) device.

Figure 2A:
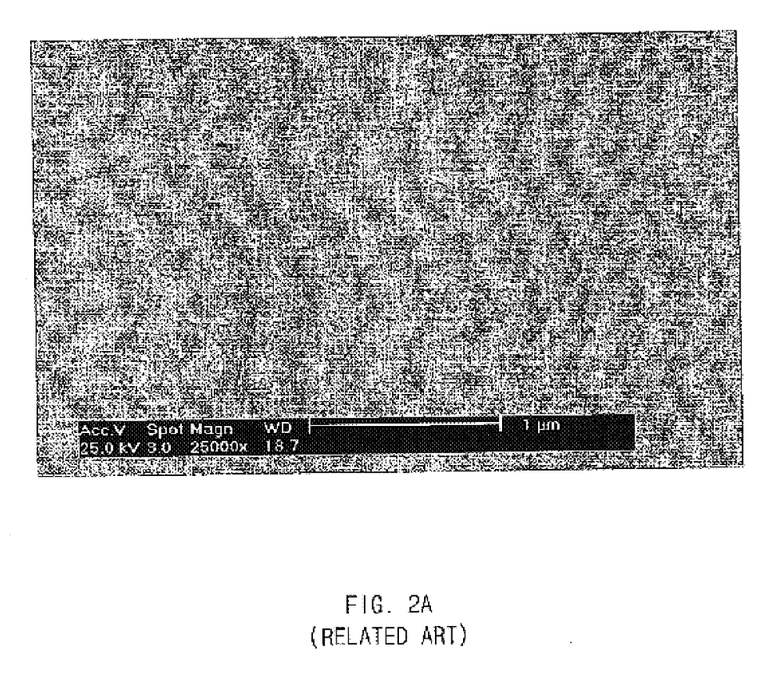
FIGS. 2A to 2E are scanning electron microscopic (SEM) photographs taken according to an elapse of time and illustrating surface states of plated silver (Ag) using an related art electroless plating solution.
Figure 2B:
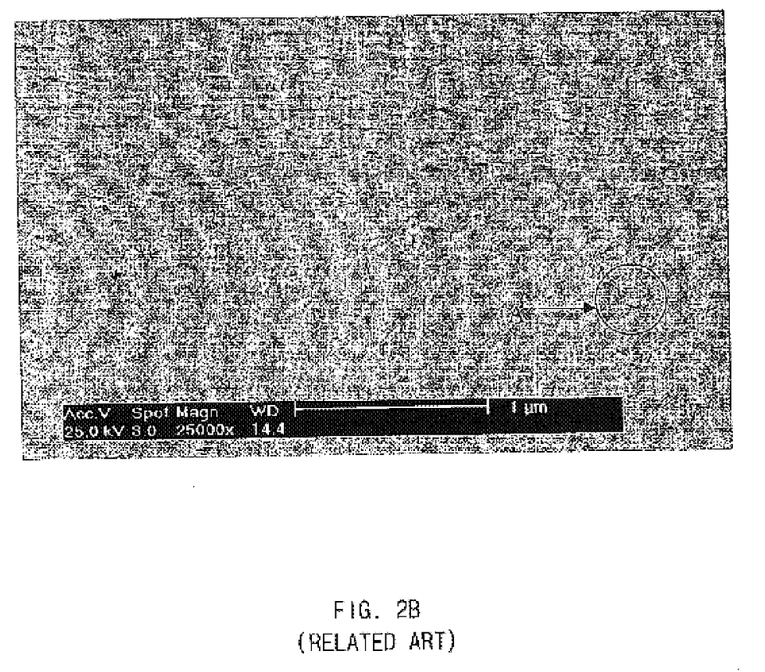
Figure 2C:
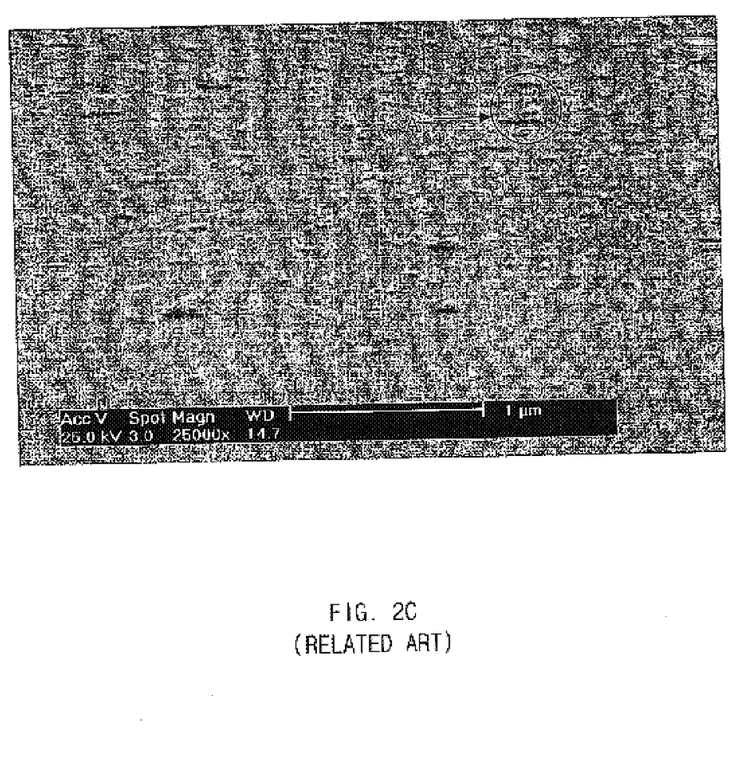
Figure 2D:
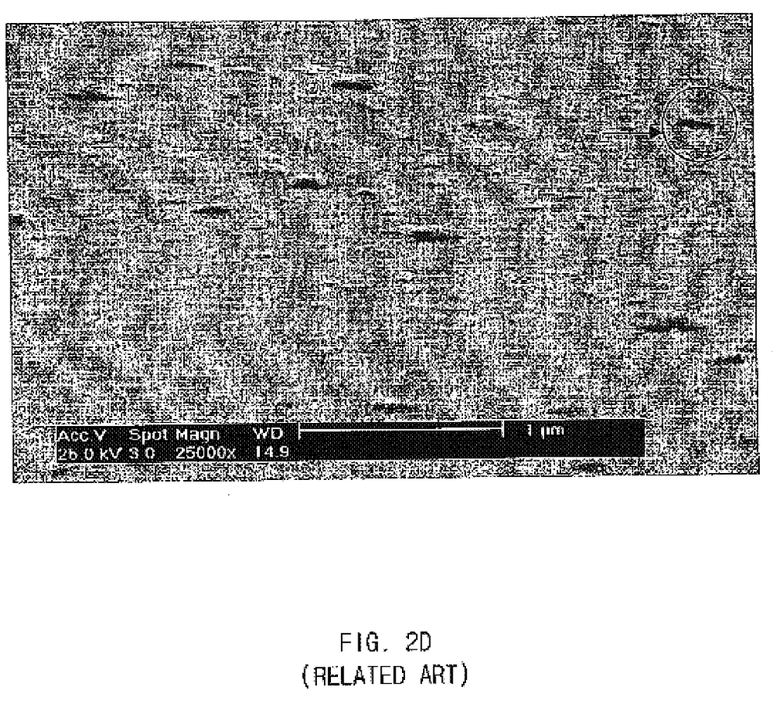
Figure 2E:
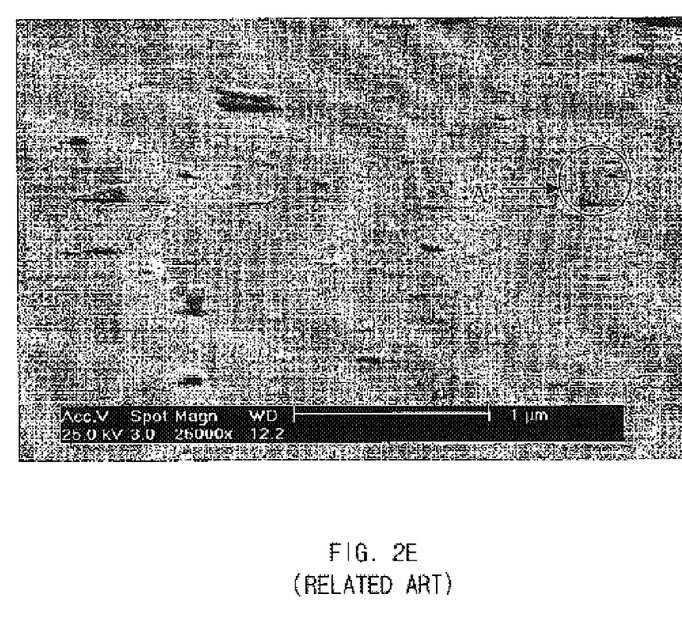

FIGS. 2A to 2E are scanning electron microscopic (SEM) photographs taken according to an elapse of time and illustrating surface states of plated silver (Ag) using an related art electroless plating solution. FIG. 2A is taken after five seconds from a commencement of the silver (Ag) electroless plating reaction, FIG. 2B ten seconds, FIG. 2C twenty seconds, FIG. 2D thirty seconds and FIG. 2E sixty seconds. As shown in the figures, agglomerations "A" becomes bigger as time elapses. It is experimentally found out that values of resistance and roughness of the grown agglomeration are very high. Therefore, the present invention is designed to prevent the agglomeration of the silver (Ag) by mixing magnesium (Mg) compound with the electroless plating solution. According to the present invention, the agglomeration of silver (Ag) can be prevented by a reaction of magnesium ions, and consequently a specific resistance of the silver (Ag) can be lowered.

SUMMARY OF THE INVENTION

Accordingly, the present invention is directed to a method of silver (Ag) electroless plating on indium tin oxide (ITO) electrode and other metal electro lines for a liquid crystal display (LCD) device or a semiconductor element that obviates one or more of problems due to limitations and disadvantages of the related art.

An advantage of the present invention is to provide an electroless plating method for plating silver (Ag) on an indium tin oxide (ITO) electrode in which magnesium (Mg) is added to an electroless plating solution to prevent agglomeration of the silver (Ag) and thus obtain a low specific resistance of the plated silver (Ag) on indium tin oxide (ITO) electrode.

Another advantage of the present invention is to provide an electroless plating method for plating silver (Ag) on a metal electro line in which magnesium (Mg) is added to an electroless plating solution to prevent agglomeration of the silver (Ag) and thus obtain a low specific resistance of the plated silver (Ag) on the metal electro line.

Another advantage of the present invention is to provide an electroless plating method for plating silver (Ag) on an indium tin oxide (ITO) electrode for a liquid crystal display (LCD) device in which magnesium (Mg) is added to an electroless plating solution to prevent agglomeration of the silver (Ag) and thus obtain a low specific resistance of the plated silver (Ag) on indium tin oxide (ITO) electrode.

Another advantage of the present invention is to provide an electroless plating method for plating silver (Ag) on a metal electro line for a liquid crystal display (LCD) device in which magnesium (Mg) is added to an electroless plating solution to prevent agglomeration of the silver (Ag) and thus obtain a low specific resistance of the plated silver (Ag) on the metal electro line.

Another advantage of the present invention is to provide an electroless plating method for plating silver (Ag) on a metal electro line for a semiconductor element in which magnesium (Mg) is added to an electroless plating solution to prevent agglomeration of the silver (Ag) and thus obtain a low specific resistance of the plated silver (Ag) on the metal electro line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of silver (Ag) electroless plating on an indium tin oxide (ITO) electrode comprises preparing a substrate on which the indium tin oxide (ITO) electrode is formed, forming a tin (Sn) film on the indium tin oxide (ITO) electrode, forming a silver (Ag) film on the indium tin oxide (ITO) electrode by dipping the indium tin oxide (ITO) electrode into an activation solution and plating silver (Ag) on the indium tin oxide (ITO) electrode by dipping the indium tin oxide (ITO) electrode into an electroless plating solution containing magnesium ions and silver ions. The electroless plating solution further includes cobalt sulfate ($CoSO_4$), ammonia ($NH_3$) and ammonium sulfate ($NH_3SO_4$). The activation solution includes silver nitrate ($AgNO_3$). Magnesium hydroxide ($Mg(OH)_2$) is used for producing the magnesium ions and silver nitrate ($AgNO_3$) is used for producing the silver ions. A thickness of plated silver (Ag) on the indium tin oxide (ITO) electrode is between 2900 Å and 3200 Å. A specific resistance of the plated silver (Ag) on the indium tin oxide (ITO) electrode is between 3 and 3.5 $\mu\Omega$·cm. The method for silver (Ag) electroless plating further comprises performing a heat treatment to the plated silver (Ag). The specific resistance of the plated silver (Ag) after the heat treatment is between 1.6 and 2.5 $\mu\Omega$·cm.

A method of silver (Ag) electroless plating on a metal electro line comprises preparing a substrate on which the metal electro line is formed, forming a silver (Ag) film on the metal electro line by dipping the metal electro line into an activation solution and plating silver (Ag) on the metal electro line by dipping the metal electro line into an electroless plating solution containing magnesium ions and silver ions. The electroless plating solution further includes cobalt sulfate ($CoSO_4$), ammonia ($NH_3$) and ammonium sulfate ($NH_3SO_4$). The activation solution includes silver nitrate ($AgNO_3$). Magnesium hydroxide ($Mg(OH)_2$) is used for producing the magnesium ions and silver nitrate ($AgNO_3$) is used for producing the silver ions. The method for silver (Ag) electroless plating further comprises performing a heat treatment to the plated silver (Ag).

A method of silver (Ag) electroless plating on an indium tin oxide (ITO) electrode for a liquid crystal display (LCD) device comprises preparing a substrate on which the indium tin oxide (ITO) electrode is formed, forming a tin (Sn) film on the indium tin oxide (ITO) electrode, forming a silver (Ag) film on the indium tin oxide (ITO) electrode by dipping the indium tin oxide (ITO) electrode into an activation solution, and plating silver (Ag) on the indium tin oxide (ITO) electrode by dipping the indium tin oxide (ITO) electrode into an electroless plating solution containing magnesium ions and silver ions. The electroless plating solution further includes cobalt sulfate ($CoSO_4$), ammonia ($NH_3$) and ammonium sulfate ($NH_3SO_4$). The activation solution includes silver nitrate ($AgNO_3$). Magnesium hydroxide ($Mg(OH)_2$) is used for producing the magnesium ions and silver nitrate ($AgNO_3$) is used for producing the silver ions. A thickness of plated silver (Ag) on the indium tin oxide (ITO) electrode is between 2900 Å and 3200 Å. A specific resistance of the plated silver (Ag) on the indium tin oxide (ITO) electrode is between 3 and 3.5 $\mu\Omega$·cm. The method for silver (Ag) electroless plating further comprises performing a heat treatment to the plated silver (Ag). The specific resistance of the plated silver (Ag) after the heat treatment is between about 1.6 and about 2.5 $\mu\Omega$·cm.

A method of silver (Ag) electroless plating on a metal electro line for a liquid crystal display (LCD) device comprises preparing a substrate on which the metal electro line is formed, forming a silver (Ag) film on the metal electro line by dipping the metal electro line into an activation solution and plating silver (Ag) on the metal electro line by dipping the metal electro line into an electroless plating solution containing magnesium ions and silver ions. The electroless plating solution further includes cobalt sulfate ($CoSO_4$), ammonia ($NH_3$) and ammonium sulfate ($NH_3SO_4$). The activation solution includes silver nitrate ($AgNO_3$). Magnesium hydroxide ($Mg(OH)_2$) is used for producing the magnesium ions and silver nitrate ($AgNO_3$) is used for producing the silver ions. The method for silver (Ag) electroless plating further comprises performing a heat treatment to the plated silver (Ag).

A method of silver (Ag) electroless plating on a metal electro line for a semiconductor element comprises preparing a substrate on which the metal electro line is formed, forming a silver (Ag) film on the metal electro line by dipping the metal electro line into an activation solution and plating silver (Ag) on the metal electro line by dipping the metal electro line into an electroless plating solution containing magnesium ions and silver ions. The electroless plating solution further includes cobalt sulfate ($CoSO_4$), ammonia ($NH_3$) and ammonium sulfate ($NH_3SO_4$). The activation solution includes silver nitrate ($AgNO_3$). Magnesium hydroxide ($Mg(OH)_2$) is used for producing the magnesium ions and silver nitrate ($AgNO_3$) is used for producing the silver ions. The method for silver (Ag) electroless plating further comprises performing a heat treatment to the plated silver (Ag).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

A characteristic of the present invention is that silver (Ag) is plated on indium tin oxide (ITO) electrode with electroless plating solution into which magnesium compound is added to prevent an agglomeration phenomenon of the plated silver. More specifically, if the magnesium compound is added to the electroless plating solution containing a reducing agent to plate silver (Ag) on an electrode, the agglomeration of the silver (Ag) is prevented and thus the plated silver does not grow three-dimensionally but two-dimensionally. A reduction potential of the magnesium (Mg) is about—2.356 V vs. NHE (normal hydrogen electrode) and a reduction potential of silver (Ag) is about 0.7991 V vs. NHE (normal hydrogen electrode). Because the reduction potential of the magnesium (Mg) is relatively much lower than that of the silver (Ag), the magnesium (Mg) tends to be more easily oxidized than the silver (Ag) and thus serves to prevent the silver (Ag) from agglomerating while it exists in a plated silver (Ag) thin film. A method for plating silver (Ag) on the indium tin oxide (ITO) electrode using electroless plating solution into which the magnesium (Mg) is contained, will be described with reference to FIGS. 3A to 3C.

Figure 3A:
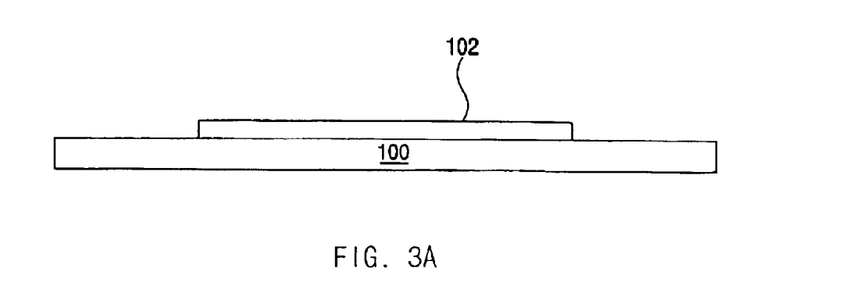
FIGS. 3A to 3C are cross-sectional views illustrating a plating sequence of a silver (Ag) on indium tin oxide (ITO) electrode or other metal electro lines according to the present invention.
Figure 3B:
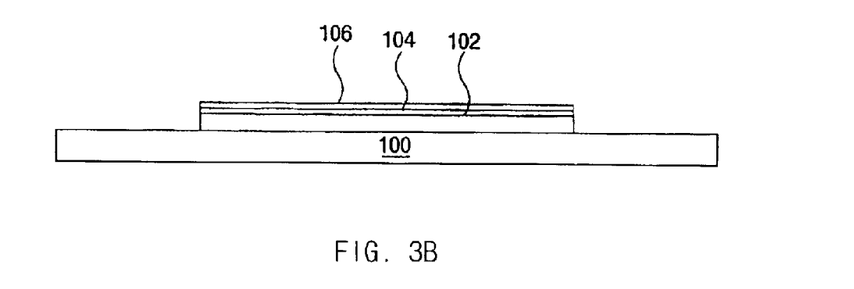
Figure 3C:
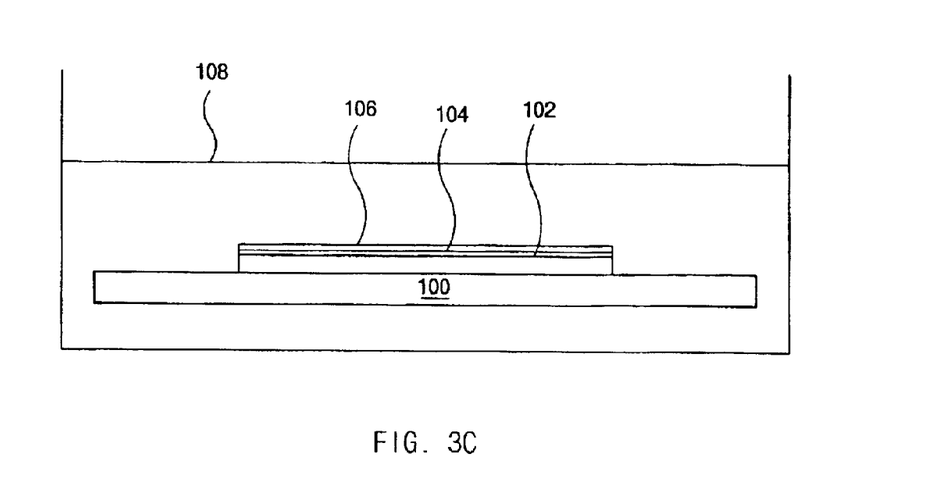

FIGS. 3A to 3C are cross-sectional views illustrating a plating sequence of silver (Ag) on the indium tin oxide (ITO) according to the present invention. In FIG. 3A, an indium tin oxide (ITO) electrode 102 is formed by depositing indium tin oxide (ITO) on a transparent substrate 100 and patterning it.

In FIG. 3B, a tin (Sn) film 104 is formed on the indium tin oxide (ITO) electrode by dipping the indium tin oxide (ITO) electrode 102 into a tin (Sn) solution for five minutes to activate a surface of the indium tin oxide (ITO) electrode 102. A silver (Ag) film 106, which is used as a catalytic metal, is subsequently formed on the tin (Sn) film 104 by dipping the indium tin oxide (ITO) electrode 102 into activation solution. The tin solution for forming the tin (Sn) film 104 on the indium tin oxide (ITO) electrode 102 is a mixture of a tin chloride ($SnCl_2$) of about 7 g/100 ml and a hydrochloric acid (HCl) of about 23 ml/100 ml. The activation solution for forming silver (Ag) film 106 on the tin (Sn) film 104 contains silver nitrate ($AgNO_3$) of about 10 g/100 ml.

In FIG. 3C, silver (Ag) is plated on the indium tin oxide (ITO) electrode 102 of which a surface is activated by the electroless plating method. That is, the silver (Ag) is plated on the indium tin oxide (ITO) electrode 102 by dipping the indium tin oxide (ITO) electrode 102 having the silver (Ag) film 106 thereon into electroless plating solution 108 that contains the magnesium (Mg) compound and cobalt sulfate ($CoSO_4$) for about 10 minutes. The electroless plating solution 108 contains ammonium sulfate ($NH_3SO_4$), ammonia ($NH_3$), magnesium hydroxide ($Mg(OH)_2$), silver nitrate ($AgNO_3$) and cobalt sulfate ($CoSO_4$). A concentration of the ammonium sulfate ($NH_3SO_4$) may be between 0.3 and 0.8 M (molarity), the ammonia ($NH_3$) 7 and 10 M (molarity), the magnesium hydroxide ($Mg(OH)_2$) 0.01 and 0.05 g/L, the silver nitrate ($AgNO_3$) 0.03 and 0.08 M (molarity) and cobalt sulfate ($CoSO_4$) 0.1 and 0.2 M (molarity). However, a desirable concentration of the ammonium sulfate ($NH_3SO_4$) is 0.45 M (molarity), the ammonia ($NH_3$) 9.26 M (molarity), the magnesium hydroxide ($Mg(OH)_2$) 0.03 g/L, the silver nitrate ($AgNO_3$) 0.048 M (molarity) and cobalt sulfate ($CoSO_4$) 0.13 M (molarity). A thickness of the plated silver (Ag) on the indium tin oxide (ITO) electrode 102 is about 3100 Å and a specific resistance of the plated silver is about 3.27 $\mu\Omega$·cm. The specific resistance value of the plated silver (Ag) is a relatively low value and can further be lowered if it undergoes a heat treatment process. For example, the specific resistance of the plated silver (Ag) is lowered to about 2.39 $\mu\Omega$·cm after the heat treatment of about thirty minutes at a temperature of about 250° C. A surface state of the plated silver (Ag) at this time can be observed in FIG. 4.

Figure 4:
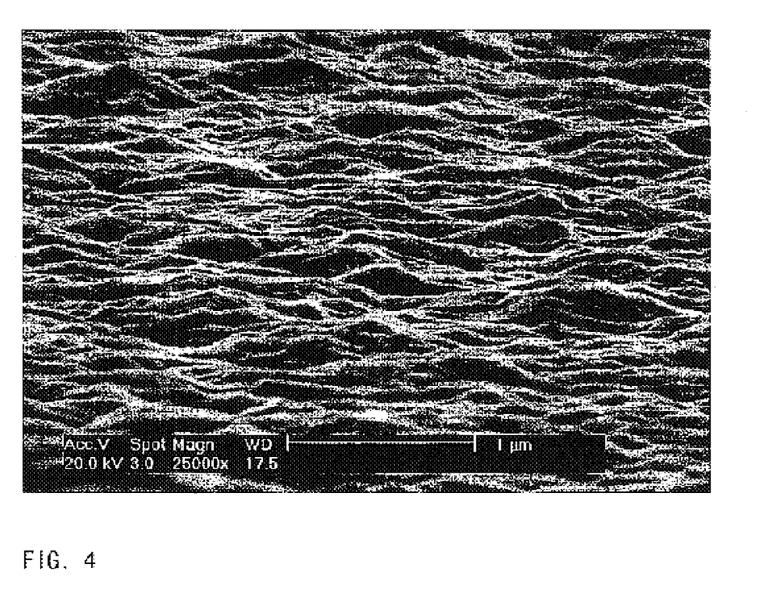
FIG. 4 is a scanning electron microscopic (SEM) photograph illustrating a surface state of plated silver (Ag) according to the present invention.

FIG. 4 is a scanning electron microscopic (SEM) photograph illustrating the surface state of the plated silver (Ag) after the heat treatment of thirty minutes at a temperature of 250° C. As it can be seen from the figure, the agglomerations of silver (Ag) are not observed on a surface of the plated silver (Ag), which is different from the related art plated silver surface as in FIGS. 2A to 2E.

Consequently, if magnesium (Mg) is added to the electroless plating solution for plating silver (Ag) on the indium tin oxide (ITO) electrode, the silver (Ag) can smoothly grow two-dimensionally on the indium tin oxide (ITO) electrode and thus a performance of element having the plated silver (Ag) can be improved.

A thickness of plated (Ag) on the indium tin oxide (ITO) may be between about 2900 Å and about 3200 Å. A specific resistance of the plated silver (Ag) on the indium tin oxide may be between about 3 and 3.5 $\mu\Omega$·cm. The specific resistance of the plated silver (Ag) after heat treatment may be between about 1.6 and about 2.5 $\mu\Omega$·cm.

The above-mentioned electroless plating technique can also be applied to metal electro lines of a liquid crystal display (LCD) device other than the indium tin oxide (ITO) electrode and to semiconductor elements having several metal electro lines. That is, the present invention can be applied to metal lines of the semiconductor elements such as metal lines for a gate electrode, a capacitor, source and drain electrodes or first and second metal line layers. For example, in case of plating silver (Ag) on the gate electrode for the semiconductor element, the transparent substrate 100 of FIGS. 3A to 3C should be substituted for a semiconductor substrate 100 and the indium tin oxide (ITO) electrode 102 of FIGS. 3A to 3C should be substituted for the gate electrode 102. Except the semiconductor substrate 100 and the gate electrode 102 of FIGS. 3A to 3C, other elements and reference numbers in FIGS. 3A to 3C are same as those for the case of the indium tin oxide (ITO) electrode. However, the tin (Sn) film 104 may be omitted when the indium tin oxide (ITO) electrode is substituted for other metal lines for the liquid crystal display (LCD) device or the semiconductor element because the tin (Sn) film forming process is specially for activating the surface of the indium tin oxide (ITO) electrode. Accordingly the silver (Ag) film 106 may be directly formed on the gate electrode 102 of FIGS. 3A to 3C or on other metal lines of the liquid crystal display (LCD) device or the semiconductor element.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of silver (Ag) electroless plating on an indium tin oxide (ITO) electrode, comprising:
   preparing a substrate on which the indium tin oxide (ITO) electrode is formed;
   forming a tin (Sn) film on the indium tin oxide (ITO) electrode;
   forming a silver (Ag) film on the indium tin oxide (ITO) electrode by dipping the indium tin oxide (ITO) electrode into an activation solution; and
   plating silver (Ag) on the indium tin oxide (ITO) electrode by dipping the indium tin oxide (ITO) electrode into an electroless plating solution containing magnesium ions and silver ions.

2. The method according to claim 1, wherein the electroless plating solution further includes cobalt sulfate ($CoSO_4$), ammonia ($NH_3$) and ammonium sulfate ($NH_3SO_4$).

3. The method according to claim 2, wherein a concentration of the cobalt sulfate ($CoSO_4$) is between 0.1 and 0.2 M (molarity).

4. The method according to claim 2, wherein a concentration of the ammonia ($NH_3$) is between 7 and 10 M (molarity).

5. The method according to claim 2, wherein a concentration of the ammonium sulfate ($NH_3SO_4$) is between 0.3 and 0.8 M (molarity).

6. The method according to claim 1, wherein the activation solution includes silver nitrate ($AgNO_3$).

7. The method according to claim 1, wherein magnesium hydroxide ($Mg(OH)_2$) is used for producing the magnesium ions and silver nitrate ($AgNO_3$) is used for producing the silver ions.

8. The method according to claim 7, wherein a concentration of the magnesium hydroxide ($Mg(OH)_2$) is between 0.01 and 0.05 g/L.

9. The method according to claim 7, wherein a concentration of the silver nitrate ($AgNO_3$) is between 0.03 and 0.08 M (molarity).

10. The method according to claim 1, wherein a thickness of plated silver (Ag) on the indium tin oxide (ITO) electrode is between about 2900 Å and about 3200 Å.

11. The method according to claim 1, wherein a specific resistance of the plated silver (Ag) on the indium tin oxide (ITO) electrode is between about 3 and about 3.5 $\mu\Omega\cdot cm$.

12. The method according to claim 1, further comprising performing a heat treatment to the plated silver (Ag).

13. The method according to claim 12, wherein the specific resistance of the plated silver (Ag) after the heat treatment is between about 1.6 and about 2.5 $\mu\Omega\cdot cm$.

14. A method of silver (Ag) electroless plating on a metal line, comprising:
   preparing a substrate on which the metal electro line is formed;
   forming a silver (Ag) film on the metal line by dipping the metal line into an activation solution; and
   plating silver (Ag) on the metal line by dipping the metal line into an electroless plating solution containing magnesium ions and silver ions.

15. The method according to claim 14, wherein the electroless plating solution further includes cobalt sulfate ($CoSO_4$), ammonia ($NH_3$) and ammonium sulfate ($NH_3SO_4$).

16. The method according to claim 15, wherein a concentration of the cobalt sulfate ($CoSO_4$) is between 0.1 and 0.2 M (molarity).

17. The method according to claim 15, wherein a concentration of the ammonia ($NH_3$) is between 7 and 10 M (molarity).

18. The method according to claim 15, wherein a concentration of the ammonium sulfate ($NH_3SO_4$) is between 0.3 and 0.8 M (molarity).

19. The method according to claim 14, wherein the activation solution includes silver nitrate ($AgNO_3$).

20. The method according to claim 14, wherein magnesium hydroxide ($Mg(OH)_2$) supplies the magnesium ions and silver nitrate ($AgNO_3$) supplies the silver ions.

21. The method according to claim 20, wherein a concentration of the magnesium hydroxide ($Mg(OH)_2$) is between 0.01 and 0.05 g/L.

22. The method according to claim 20, wherein a concentration of the silver nitrate ($AgNO_3$) is between 0.03 and 0.08 M (molarity).

23. The method according to claim 14, further comprising performing a heat treatment to the plated silver (Ag).

24. The method according to claim 14, wherein the magnesium ions prevent agglomeration of the plated silver (Ag).

25. A method of silver (Ag) electroless plating on an indium tin oxide (ITO) electrode for a liquid crystal display (LCD) device, comprising:
   preparing a substrate on which the indium tin oxide (ITO) electrode is formed;
   forming a tin (Sn) film on the indium tin oxide (ITO) electrode;
   forming a silver (Ag) film on the indium tin oxide (ITO) electrode by dipping the indium tin oxide (ITO) electrode into an activation solution; and
   plating silver (Ag) on the indium tin oxide (ITO) electrode by dipping the indium tin oxide (ITO) electrode into an electroless plating solution containing magnesium ions and silver ions.

26. The method according to claim 25, wherein the electroless plating solution further includes cobalt sulfate ($CoSO_4$), ammonia ($NH_3$) and ammonium sulfate ($NH_3SO_4$).

27. The method according to claim 26, wherein a concentration of the cobalt sulfate ($CoSO_4$) is between 0.1 and 0.2 M (molarity).

28. The method according to claim 26, wherein a concentration of the ammonia ($NH_3$) is between 7 and 10 M (molarity).

29. The method according to claim 26, wherein a concentration of the ammonium sulfate ($NH_3SO_4$) is between 0.3 and 0.8 M (molarity).

30. The method according to claim 25, wherein the activation solution includes silver nitrate ($AgNO_3$).

31. The method according to claim 25, wherein magnesium hydroxide ($Mg(OH)_2$) supplies the magnesium ions and silver nitrate ($AgNO_3$) supplies the silver ions.

32. The method according to claim 31, wherein a concentration of the magnesium hydroxide ($Mg(OH)_2$) is between 0.01 and 0.05 g/L.

33. The method according to claim 31, wherein a concentration of the silver nitrate ($AgNO_3$) is between 0.03 and 0.08 M (molarity).

34. The method according to claim 25, wherein a thickness of plated silver (Ag) on the indium tin oxide (ITO) electrode is between about 2900 Å and about 3200 Å.

35. The method according to claim 25, wherein a specific resistance of the plated silver (Ag) on the indium tin oxide (ITO) electrode is between about 3 and about 3.5 $\mu\Omega\cdot cm$.

36. The method according to claim 25, further comprising performing a heat treatment to the plated silver (Ag).

37. The method according to claim 36, wherein the specific resistance of the plated silver (Ag) after the heat treatment is between about 1.6 and about 2.5 $\mu\Omega\cdot cm$.

38. A method of silver (Ag) electroless plating on a metal line for a liquid crystal display (LCD) device, comprising:

preparing a substrate on which the metal line is formed;

forming a silver (Ag) film on the metal electro line by dipping the metal line into an activation solution; and plating silver (Ag) on the metal electro line by dipping the metal line into an electroless plating solution containing magnesium ions and silver ions.

39. The method according to claim 38, wherein the electroless plating solution further includes cobalt sulfate ($CoSO_4$), ammonia ($NH_3$) and ammonium sulfate ($NH_3SO_4$).

40. The method according to claim 39, wherein a concentration of the cobalt sulfate ($CoSO_4$) is between 0.1 and 0.2 M (molarity).

41. The method according to claim 39, wherein a concentration of the ammonia ($NH_3$) is between 7 and 10 M (molarity).

42. The method according to claim 39, wherein a concentration of the ammonium sulfate ($NH_3SO_4$) is between 0.3 and 0.8 M (molarity).

43. The method according to claim 38, wherein the activation solution includes silver nitrate ($AgNO_3$).

44. The method according to claim 38, wherein magnesium hydroxide ($Mg(OH)_2$) supplies the magnesium ions and silver nitrate ($AgNO_3$) supplies the silver ions.

45. The method according to claim 44, wherein a concentration of the magnesium hydroxide ($Mg(OH)_2$) is between 0.01 and 0.05 g/L.

46. The method according to claim 44, wherein a concentration of the silver nitrate ($AgNO_3$) is between 0.03 and 0.08 M (molarity).

47. The method according to claim 38, further comprising performing a heat treatment to the plated silver (Ag).

48. A method of silver (Ag) electroless plating on a metal line for a semiconductor element, comprising:

preparing a substrate on which the metal line is formed;

forming a silver (Ag) film on the metal line by dipping the metal line into an activation solution; and plating silver (Ag) on the metal line by dipping the metal line into an electroless plating solution containing magnesium ions and silver ions.

49. The method according to claim 48, wherein the electroless plating solution further includes cobalt sulfate ($CoSO_4$), ammonia ($NH_3$) and ammonium sulfate ($NH_3SO_4$).

50. The method according to claim 49, wherein a concentration of the cobalt sulfate ($CoSO_4$) is between 0.1 and 0.2 M (molarity).

51. The method according to claim 49, wherein a concentration of the ammonia ($NH_3$) is between 7 and 10 M (molarity).

52. The method according to claim 49, wherein a concentration of the ammonium sulfate ($NH_3SO_4$) is between 0.3 and 0.8 M (molarity).

53. The method according to claim 48, wherein the activation solution includes silver nitrate ($AgNO_3$).

54. The method according to claim 48, wherein magnesium hydroxide ($Mg(OH)_2$) supplies the magnesium ions and silver nitrate ($AgNO_3$) supplies the silver ions.

55. The method according to claim 54, wherein a concentration of the magnesium hydroxide ($Mg(OH)_2$) is between 0.01 and 0.05 g/L.

56. The method according to claim 54, wherein a concentration of the silver nitrate ($AgNO_3$) is between 0.03 and 0.08 M (molarity).

57. The method according to claim 48, further comprising performing a heat treatment to the plated silver (Ag).

* * * * *